(12) United States Patent
Kim

(10) Patent No.: US 6,497,797 B1
(45) Date of Patent: Dec. 24, 2002

(54) METHODS OF FORMING SPUTTERING TARGETS, AND SPUTTERING TARGETS FORMED THEREBY

(75) Inventor: Jaeyeon Kim, Veradale, WA (US)

(73) Assignee: Honeywell International Inc., Morristown, NJ (US)

( * ) Notice: Subject to any disclaimer, the term of this patent is extended or adjusted under 35 U.S.C. 154(b) by 64 days.

(21) Appl. No.: 09/643,038

(22) Filed: Aug. 21, 2000

(51) Int. Cl.$^7$ .......................... C23C 14/34; C23C 14/32
(52) U.S. Cl. ............................ 204/192.13; 204/192.12; 204/192.1; 204/298.03; 204/298.12; 204/298.13
(58) Field of Search ........................ 204/192.1, 192.12, 204/298.12, 298.13, 192.13, 298.03

(56) References Cited

U.S. PATENT DOCUMENTS

| | | | |
|---|---|---|---|
| 5,215,639 A | 6/1993 | Boys ..................... | 204/192.12 |
| 5,428,882 A | 7/1995 | Makowiecki et al. ...... | 29/527.5 |
| 6,068,742 A | 5/2000 | Daxinger et al. ....... | 204/298.09 |
| 6,086,735 A | 7/2000 | Gilman et al. ......... | 204/298.12 |

FOREIGN PATENT DOCUMENTS

| | | | | |
|---|---|---|---|---|
| JP | 61-099674 | 5/1986 | | |
| JP | 63-042369 | 2/1988 | | |
| JP | 01-132757 | 5/1989 | | |
| JP | 06-306597 | 1/1994 | | |
| JP | 6-140330 | * 5/1994 | ............ | 204/298.12 |
| JP | 08-060353 | 3/1996 | | |
| JP | 08-325719 | 12/1996 | | |

OTHER PUBLICATIONS

Product Literature: Praxair Surface Technologies, title: "We're on the Edge of Target Technology".

* cited by examiner

Primary Examiner—Rodney G. McDonald
(74) Attorney, Agent, or Firm—Wells St. John P.S.

(57) ABSTRACT

The invention encompasses a method of forming a sputtering target. A wear profile for a sputtering target surface is determined. The wear profile corresponds to a shape of the used target surface after the target is subjected to the wear of having material sputtered therefrom. The wear profile is divided amongst a plurality of datapoints across the target surface. A difference in height of the target surface after the wear relative to a height of the target surface prior to the wear is calculated. The difference in height calculations generate a plurality of wear definition datapoints. Target lifetime datapoints are calculated using the wear definition datapoints, and sputtering uniformity datapoints are also calculated using the wear definition datapoints. A difference between the target lifetime datapoints and sputtering uniformity datapoints is calculated. A constant corresponding to the difference between a target lifetime datapoint and a sputtering uniformity datapoint is added to the sputtering uniformity datapoints to generate a desired profile for a sputtering target sputtering surface. A sputtering target is formed having a sputtering surface with the desired profile.

39 Claims, 5 Drawing Sheets

METHODS OF FORMING SPUTTERING TARGETS, AND SPUTTERING TARGETS FORMED THEREBY

TECHNICAL FIELD

The invention pertains to methods of forming sputtering targets, and further encompasses the targets formed by the methods.

BACKGROUND OF THE INVENTION

A sputtering method is described with reference to FIG. 1, which illustrates a sputtering target 10 spaced from a substrate 12 by a distance T/S. Distance TIS is referred to as the target substrate distance. Substrate 12 can comprise, for example, a semiconductive material wafer. Target 10 can comprise numerous materials known to persons of ordinary skill in the art, such as, for example, metallic materials (e.g. one or more of aluminum, copper, titanium, tantalum, tungsten, cobalt, nickel, etc.), or ceramic materials (e.g., $BaTiO_3$, $Pb(Zr, Ti)O_3$, $BiSrTaO_3$, etc.). Also, target 10 can comprise numerous shapes. For instance, FIG. 2 illustrates that target 10 can comprise a circular shape Referring again to FIG. 1, a shield 14 is provided over a peripheral region of target 10. Shield 14 can comprise, for example, stainless steel or aluminum.

In operation, material from target 10 is sputter-deposited onto substrate 12. More specifically, target 10 has a face surface 16 which is exposed to high energy ions and/or atoms. The high energy ions and/or atoms eject atoms from surface 16, and the ejected atoms are subsequently deposited onto substrate 12. Shield 14 protects peripheral edges of target 16 from being exposed to the high energy ions and/or atoms. One of the goals in target fabrication is to deposit a uniform film of material over substrate 12. One aspect of achieving a uniform film is to have an appropriate T/S distance between target surface 16 and substrate 12, as well as to maintain a substantially common T/S distance from the entirety of the sputtered target face 16 and substrate 12. Shield 14 is provided to alleviate problems which could occur if the sloped regions of target 10 were exposed to high energy ions and/or atoms during a sputtering process.

FIG. 3 illustrates target 10 after the target has been subjected to the wear of having material sputtered therefrom. Specifically, FIG. 3 illustrates a wear profile formed across sputtered face surface 16. The illustrated wear profile is for exemplary purpose only. The shape of an actual wear profile can depend on, for example, the magnet type and target life of materials used in a sputtering process. A dashed line 18 is provided in FIG. 3 to illustrate the starting position of the face surface when target 10 was new (i.e., the face surface shown in FIG. 1). As shown in FIG. 3, a number of troughs (i.e., sputter tracks) are formed within face surface 16 during the sputtering operation. Accordingly, the target does not wear uniformly across the surface 16.

Attempts have been made to improve target lifetime by adding additional material to a target to compensate for the uneven wear pattern of FIG. 3. For instance, FIG. 4 illustrates a target 20 which attempts to compensate for the uneven wear of FIG. 3. Target 20 is shown with a dashed line 18 illustrating the position of original face 16 in the target 10 of FIGS. 1–3. FIG. 4 also shows additional material 22 provided over original position 18, and in locations which compensate for the uneven wear profile of FIG. 3. Accordingly, target 20 has a face surface 24 which effectively comprises a mirror image of the wear profile of FIG. 3.

FIG. 4 is one embodiment of prior art processes for compensating for the uneven wear profile of FIG. 3. Another embodiment is to simply form additional material 22 over various regions of 18, without necessarily creating a mirror image of the wear of FIG. 3. Regardless of which of the prior art techniques is utilized, the result is a target having relatively large peaks at positions in which wear has been most significant in prior targets. A difficulty with the processing of FIG. 4 is that target 20 has large variations in thickness across its surface, and accordingly a T/S distance relative to face 24 of target 20 varies significantly across the face. Accordingly, the uniformity of:film deposition from target 20 can be significantly less than the uniformity of film deposition from a target having a planar face. Thus, even though lifetime can be improved utilizing the target 20 of FIG. 4 instead of the target 10 of FIGS. 1–3, the loss in uniformity can render target 20 less desirable than previous targets 10 of FIGS. 1–3.

It would be desirable to develop techniques for forming targets having improved lifetimes, and which can be utilized to uniformly sputter-deposit materials on substrates.

SUMMARY OF THE INVENTION

In one aspect, the invention encompasses a method of forming a sputtering target. A wear profile for a sputtering target surface is determined. The wear profile corresponds to a shape of the target surface after the target is subjected to the wear of having material sputtered therefrom. It can be preferred to determine a wear profile from a target which has been exposed to an anticipated semiconductor wafer fabrication process (specifically, an anticipated sputtering process), for a maximum anticipated lifetime of the target. The maximum anticipated lifetime can vary depending on, for example, the sputtering chamber configuration, the target composition, and the target configuration. The wear profile is divided amongst a plurality of datapoints across the target surface. A difference in height of the target surface after the wear relative to a height of the target surface prior to the wear is calculated. The difference in height calculations generate a plurality of wear definition datapoints. Target lifetime datapoints are calculated using the wear definition datapoints, and sputtering uniformity datapoints are also calculated using the wear definition datapoints. A difference between the target lifetime datapoints and sputtering uniformity datapoints is calculated. A constant corresponding to the difference between a target lifetime datapoint and a sputtering uniformity datapoint is added to the sputtering uniformity datapoints to generate a desired profile for a sputtering target sputtering surface. A sputtering target is formed having a sputtering surface with the desired profile.

The invention encompasses another method of forming a sputtering target. A wear profile for a sputtering target surface is determined. The wear profile is divided amongst a plurality of datapoints to generate datapoints $\{S_1 \ldots S_i\}$, where "i" is a positive integer. Also, datapoints are generated to define the target surface prior to the wear, with the datapoints being $\{R_1 \ldots Ri\}$. Difference datapoints $\{A_1 \ldots A_i\}$ are generated, with each datapoint $A_n$ being defined as $R_n - S_n$. Target lifetime datapoints $\{B_1 \ldots B_i\}$ are calculated. Each datapoint $B_n$ is defined as $((A_n * y) + Q)$; where y is a constant greater than 0, and Q is a constant which can be 0. Sputtering uniformity datapoints $\{C_1 \ldots C_i\}$ are calculated, with each datapoint $C_n$ being defined as $((A_n * z) + P)$; where z is a constant greater than 0 and less than y, and where P is a constant which can be 0. Difference datapoints $\{D_1 \ldots D_i\}$ are calculated, with each difference datapoint $D_n$ being defined as $(B_n - C_e)$. The difference datapoint having the greatest magnitude is determined, and is defined as $D_{max}$. A desired profile dataset $\{E_1 \ldots E_i\}$ is generated, with each datapoint $E_n$ being defined as $(C_n + D_{max})$. A sputtering target is formed to have a sputtering surface with a profile corresponding to the desired profile dataset.

BRIEF DESCRIPTION OF THE DRAWINGS

Preferred embodiments of the invention are described below with reference to the following accompanying drawings.

FIG. 6 also illustrates datapoints defined across the target surface for utilization in embodiments of the present invention.

DETAILED DESCRIPTION OF THE PREFERRED EMBODIMENTS

The invention encompasses methodology for target design which can be utilized for designing desired profiles for sputtering target design so that the sputtering targets will have improved lifetime, and so that the sputtering targets will also sputter material to a desired uniformity. Methodology of the present invention can be utilized for improving sputtering targets of any shape, and comprising any material. The invention is described with reference to a flow chart of FIG. 5, and illustrations of FIGS. 6–11.

Figure 3:
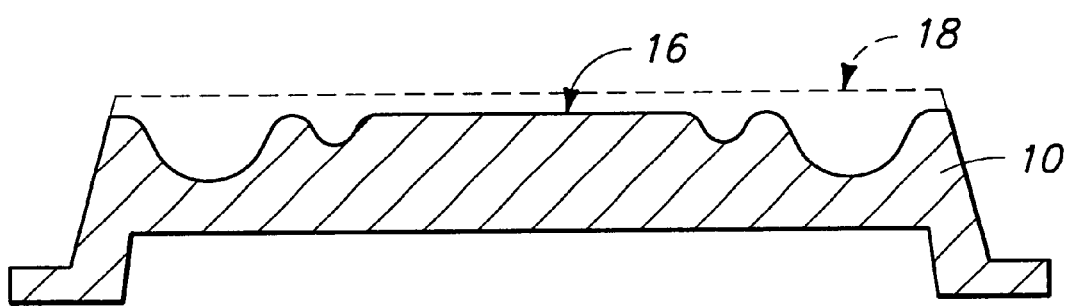
FIG. 3 is a diagrammatic, cross-sectional view of a prior art sputtering target after the target has been subjected to the wear of a sputtering operation.
Figure 4:
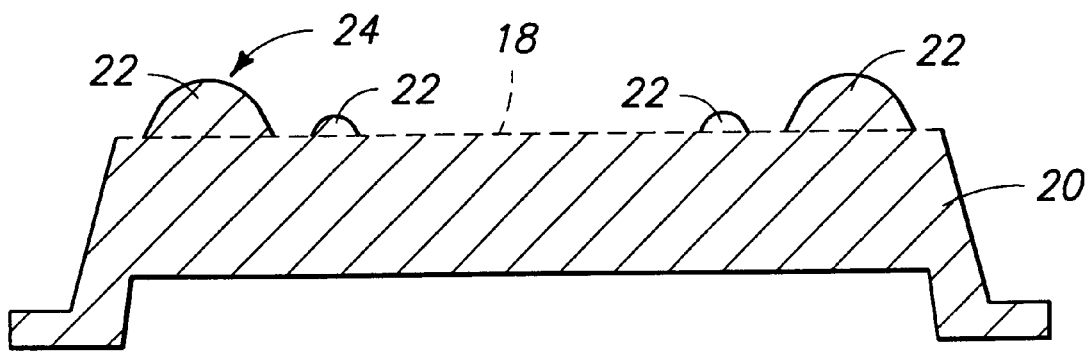
FIG. 4 is a diagrammatic, cross-sectional view of a prior art sputtering target illustrating prior art methodology for increasing the lifetime of a sputtering target.
Figure 5:
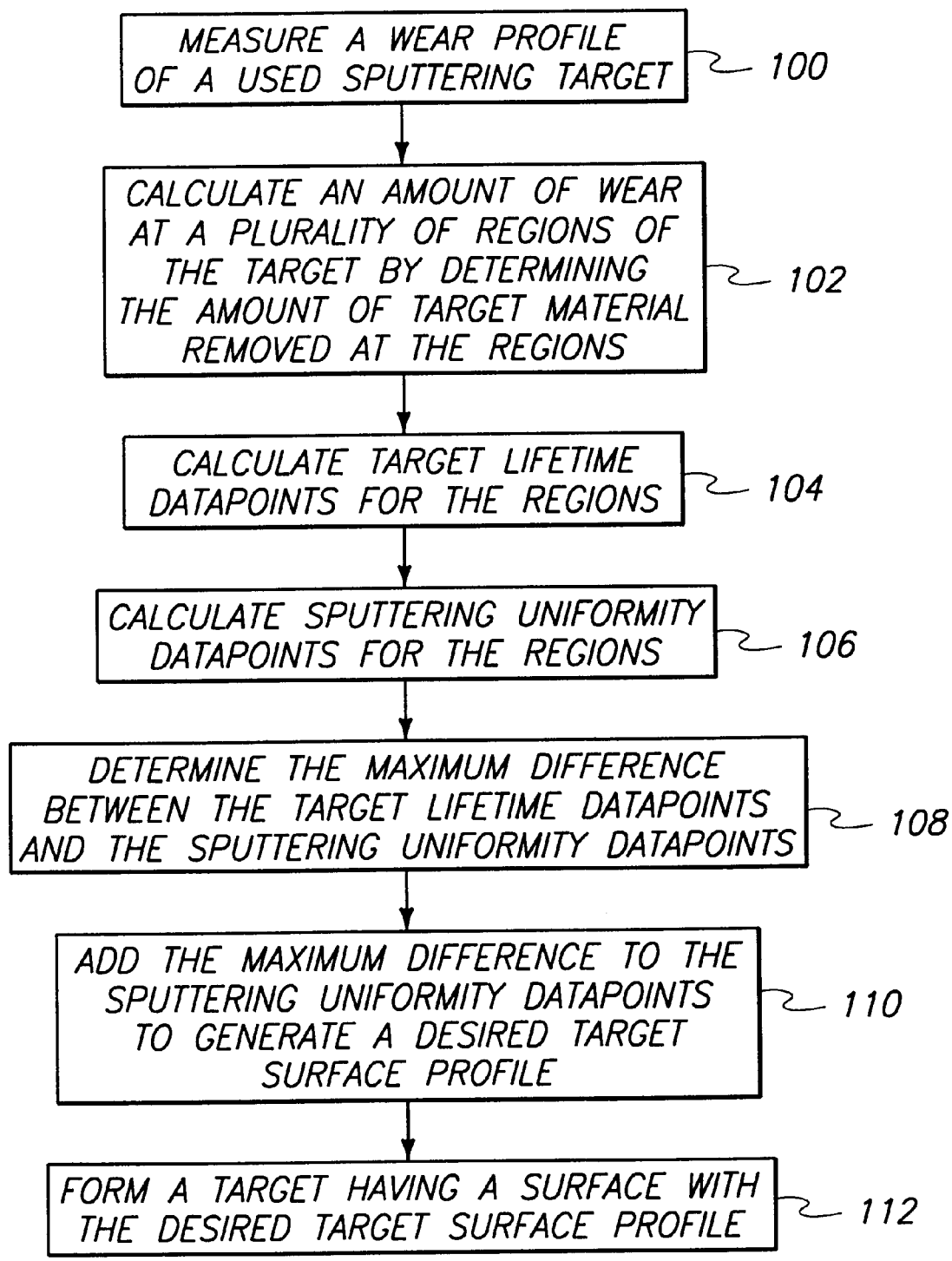
FIG. 5 is a flow chart diagram describing a method encompassed by the present invention.
Figure 6:
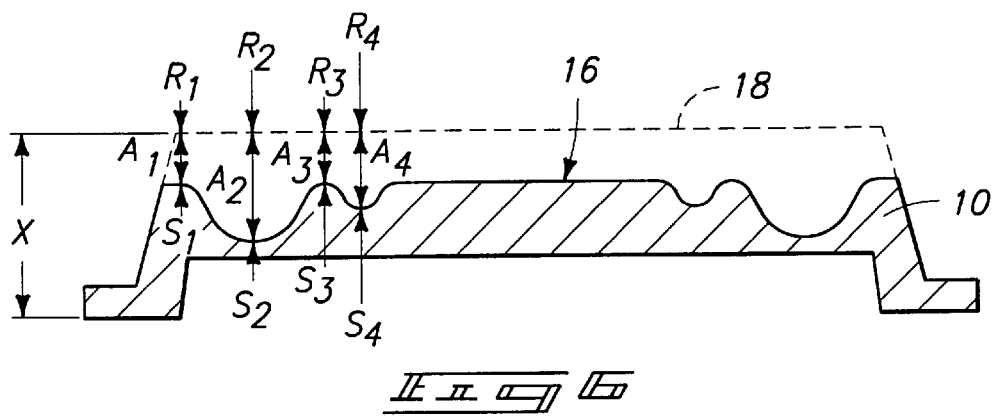
FIG. 6 is a diagrammatic, cross-sectional view of a target which has been subjected to the wear of a sputtering operation, and specifically illustrates the target of FIG. 3.

Referring to FIG. 5, an initial step of the invention is to measure a wear profile from a used sputtering target. Such is illustrated in FIG. 6, wherein the used sputtering target described previously with respect to FIG. 3 is shown. A wear profile of the sputtering target can be measured with, for example, a coordinate measuring machine. FIG. 6 shows the target 10 of FIG. 3, and shows a distance "X" relative to an initial upper surface 18 of target 10. Distance "X" can comprise, for example, about 1 ½ inches. FIG. 6 also shows a plurality of datapoints $\{A_1 \ldots A_i\}$ (wherein i is an integer greater than 0). FIG. 6 actually shows only the four datapoints $\{A_1 \ldots A_4\}$, but it is to be understood that numerous other datapoints could be acquired and processed in addition to the shown datapoints. The datapoints can be across an entirety of a sputtering target face. It is noted that although the invention is described with reference to a process wherein a target wear profile is measured, it is to be understood that a target wear profile can be determined in other ways, such as, for example, by a computer-generated model of the wear profile rather than an actual measurement of the wear profile.

The datapoints $\{A_1 \ldots A_4\}$ correspond to differences between the worn surface 16 and the initial surface 18. In practice, surface 18 is initially divided amongst a plurality of datapoints $\{R_1 \ldots R_i\}$, which, for the shown planar surface 18 will be the same as one another. Also, the worn surface 16 is divided into a plurality of datapoints $\{S_1 \ldots S_i\}$, and the datapoints $\{A_1 \ldots A_i\}$ are determined as a difference between the datapoints R and the datapoints S. Specifically, a datapoint $A_n$ is defined as $R_n - S_n$. The calculations of $\{A_1 \ldots A_i\}$ correspond to step 102 of FIG. 5, which indicates that an amount of wear is calculated at a plurality of regions of a target by determining the amount of target removed at the regions. Each of the datapoints $\{A_1 \ldots A_i\}$ corresponds to one of the regions referred to in step 102. In the shown embodiment, $A_1$, $A_2$, $A_3$ and $A_4$ have values of 4, 9, 4 and 6, respectively. The values are relative values of $A_1$, $A_2$, $A_3$ and $A_4$ to one another, and are provided for comparison of $A_1$, $A_2$, $A_3$ and $A_4$. The values have units of length, but no particular units are assigned to the values used herein as the values are for illustrative purposes only and do not correspond to actual measured values.

The number of datapoints $\{A_1 \ldots A_i\}$ that are calculated can vary depending on the processing equipment and time available. It can be desired to utilize a large number of datapoints $\{A_1 \ldots A_i\}$ in that such will generally better characterize target wear than will fewer datapoints. However, a large number of datapoints will take more processing time than will fewer datapoints. In an exemplary embodiment, the number of datapoints is chosen so that spacing between adjacent datapoints is from about 0.05 inch to about 0.5 inch.

Figure 1:
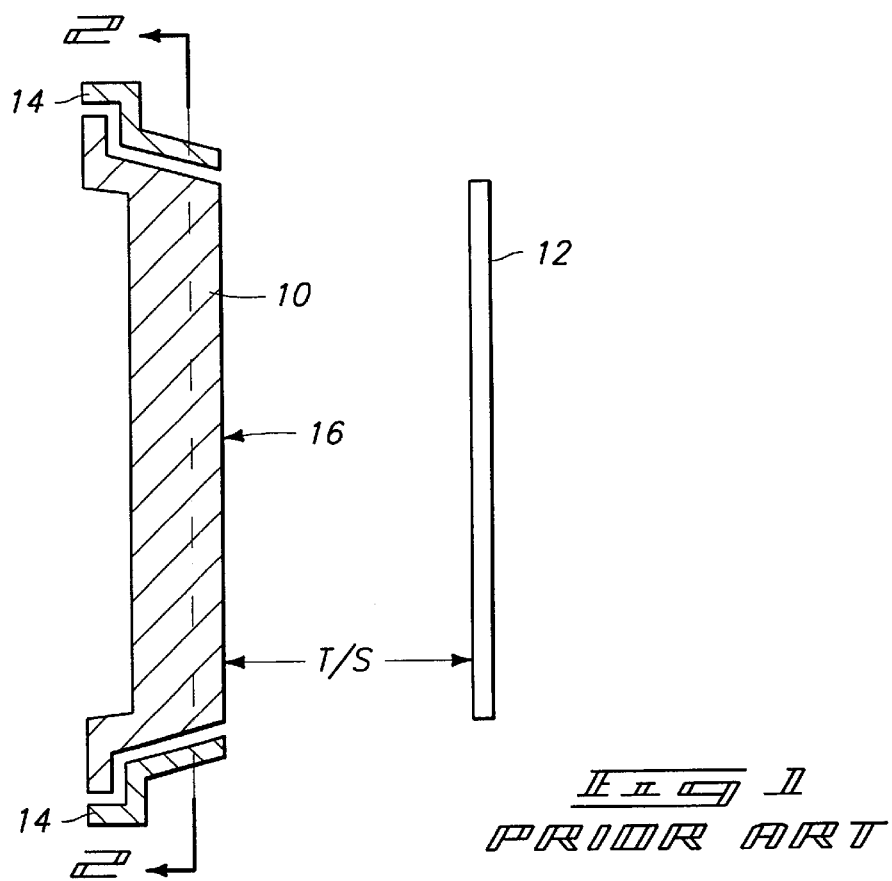
FIG. 1 is a diagrammatic, cross-sectional view illustrating a prior art sputtering target and substrate.
Figure 2:
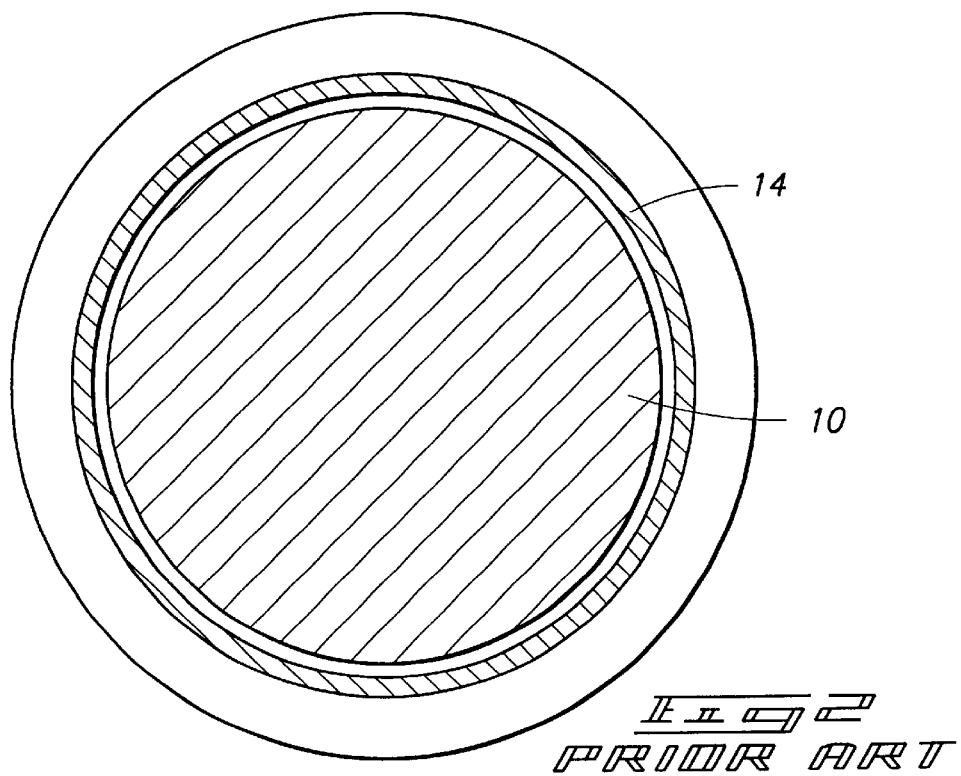
FIG. 2 is a view along the line 2—2 of FIG. 1.
Figure 7:
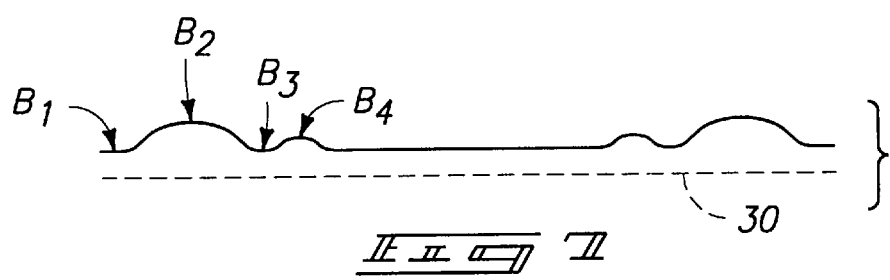
FIG. 7 illustrates a curve generated in accordance with the present invention from the datapoints of FIG. 6, and specifically illustrates a curve comprising target lifetime datapoints.

Referring to step 104 of FIG. 5, a plurality of target lifetime datapoints are calculated for the regions corresponding to $\{A_1 \ldots A_i\}$. Such calculation generates the curve shown in FIG. 7. More specifically, FIG. 7 illustrates a curve comprised of a plurality of target lifetime datapoints $\{B_1 \ldots B_i\}$. Each of the datapoints $B_n$ is defined as $((A_n{}^*y)+Q)$, where y is a constant greater than 0, and Q is a constant which can be 0. The constant y is defined as a target lifetime parameter. The target lifetime parameter can be from greater than 0 to 1, and is typically from 0.2 to 0.5, with 0.33 being an exemplary number. Ultimately, the target lifetime parameter can determine how much material is added to a target to increase the target lifetime. It can be preferred that a target lifetime be an integral of the lifetime of shields used around a periphery of the target (such as, for example, shields 14 of FIG. 1). For instance, if the shields have a lifetime of about 300 kilowatt hours it can be desirable that a target have a lifetime of either 600 kilowatt hours, 900 kilowatt hours, or 1200 kilowatt hours. Prior art targets have been produced having uncertain lifetimes. It would be desirable to develop targets having substantially exact lifetimes triple or quadruple the lifetime of shields. Methodology of the present invention can enable quality targets to be produced which have lifetimes of triple or more the lifetime of shields. The target lifetime parameter enables a lifetime of a target to be manipulated.

In the embodiment shown in FIG. 7, the target lifetime parameter is 0.5 and the constant Q is 0. Accordingly, in the shown embodiment in which $A_1$, $A_2$, $A_3$ and $A_4$ are 4, 9, 4 and 6, respectively; $B_1$, $B_2$, $B_3$ and $B_4$ are 2, 4.5, 2, and 3, respectively. The curve B is shown drawn relative to a dashed coordinate 30. Coordinate 30 is defined by the parameter "Q". The constant Q can correspond to, for example, the distance "X" of FIG. 6, or can be any other number.

Figure 8:
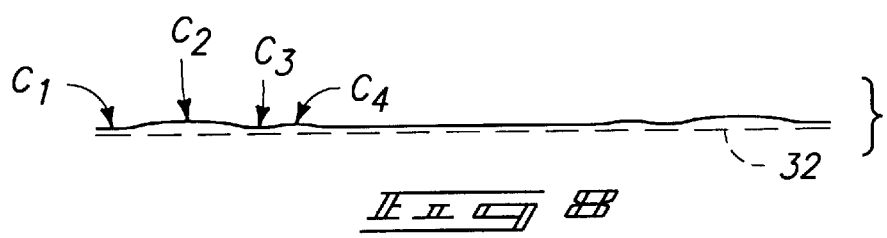
FIG. 8 illustrates a second curve generated in accordance with the present invention from the datapoints of FIG. 6, and specifically illustrates a curve comprising sputtering uniformity datapoints.

Referring to step 106 of FIG. 5, sputtering uniformity datapoints are determined for the various regions defined by datapoints $\{A_1 \ldots A_i\}$. Such is illustrated in FIG. 8, wherein the sputtering uniformity datapoints are shown as $\{C_1 \ldots C_4\}$. In practice, a plurality of datapoints $\{C_1 \ldots C_i\}$ are defined from the plurality of datapoints $\{A_1 \ldots A_i\}$. Each datapoint $C_n$ is defined as $((A_n*z)+P)$, where z is a constant greater than 0 and less than y, and where P is a constant which can be 0. The constant z is defined as a sputtering uniformity parameter. In practice, z is usually from about 0.001 to 1, and can be from about 1/16 to about 1/16. The magnitude of z can depend on, for example, one or more of a magnet type utilized in a sputtering process, a target-to-substrate distance utilized in a sputtering process, a sputtering chamber configuration, and a target composition The datapoints $\{C_1 \ldots C_i\}$ define a curve which could be utilized to form a target surface that would lead to a high uniformity of deposited material on a substrate. However, such target surface would not have a lifetime significantly improved relative to the original target surface 18 (FIG. 6).

FIG. 8 shows a curve generated using z=1/8, and specifically shows $C_1$, $C_2$, $C_3$ and $C_4$ equal to 0.5, 1.125, 0.5 and 0.75, respectively. The curve of FIG. 8 is shown relative to a coordinate 32. Coordinate 32 is defined by constant P and can, for example, correspond to the value "X" of FIG. 6. It can be preferred that coordinate 32 be identical in magnitude to coordinate 30 of FIG. 7, and accordingly it can be preferred that the constant P utilized to generate datapoints $\{C_1 \ldots C_i\}$ be identical to the constant Q utilized to generate datapoints $\{B_1 \ldots B_i\}$.

Figure 9:
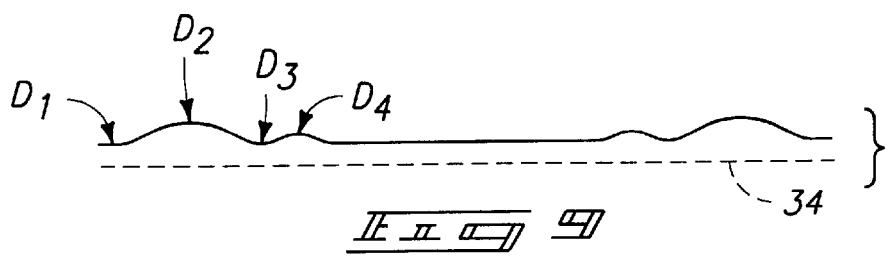
FIG. 9 illustrates a difference curve generated by subtracting the FIG. 8 curve from the FIG. 7 curve.

Referring to step 108 of FIG. 5, a maximum difference between the target lifetime datapoints and the sputtering uniformity datapoints is determined. Such is illustrated in FIG. 9, wherein a curve is generated by subtracting the curve of FIG. 8 from that of FIG. 7. Specifically, a plurality of values $\{D_1 \ldots D_i\}$ are generated with each value $D_n$ corresponding to $B_n - C_n$. The shown curve comprises $D_1 D_2$, $D_3$ and $D_4$ corresponding to 1.5, 3.38, 1.5 and 2.25, respectively. The largest difference is referred to as $D_{max}$, and in the shown embodiment corresponds to the 3.38 of $D_2$. The curve of FIG. 9 is shown relative to a coordinate 34. Coordinate 34 is determined by the difference between Q and P. If parameter Q equals parameter P then coordinate 34 will be 0. If Q is different than P, coordinate 34 will have a value, and coordinate 34 can comprise either positive or negative value. It can be preferred for P to equal Q, and accordingly for coordinate 34 to equal 0.

Figure 10:
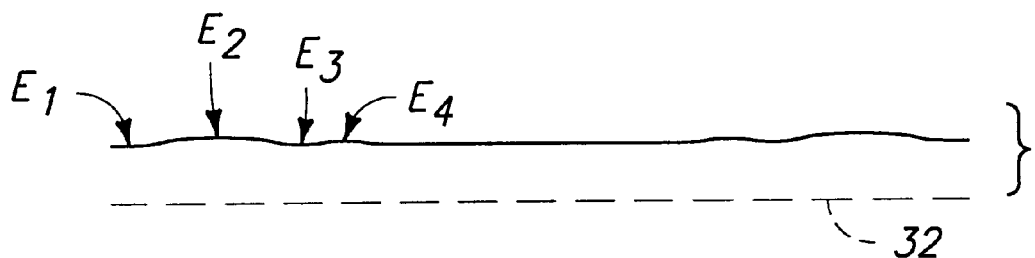
FIG. 10 illustrates a desired target surface profile determined by adding a parameter determined from the FIG. 9 curve to the datapoints of the FIG. 8 curve.

Referring to step 110 of FIG. 5, the value $D_{max}$ is added to the uniformity datapoints of FIG. 8 to generate a desired target surface profile. The desired target surface profile is shown in FIG. 10, and comprises a plurality of datapoints $\{E_1 \ldots E_i\}$. Each of the datapoints $E_n$ is calculated as $C_n + D_{max}$, with the values $C_n$ being those shown in FIG. 8. In the shown embodiment, $E_1$, $E_2$, $E_3$ and $E_4$ correspond to 3.88, 4.51, 3.88 and 4.13, respectively. It is noted that values other than $D_{max}$ can be added to the uniformity parameters of FIG. 8 to generate a desired target profile. However, if values less than $D_{max}$ are utilized, the target lifetime will be less than if $D_{max}$ were used; and if values greater than $D_{max}$ are utilized, the resulting target may be too thick to be used in desired applications. In the embodiment described herein, $D_{max}$ is an additive value calculated from the target lifetime datapoints, and is added to the uniformity datapoints of FIG. 8 to generate a desired target surface profile. It is to be understood that the invention encompasses utilization of additive values other than values calculated from target lifetime datapoints in generating a desired target profile from sputtering uniformity datapoints, but such can be less preferred in that it can render it difficult to accurately control target lifetime.

Figure 11:
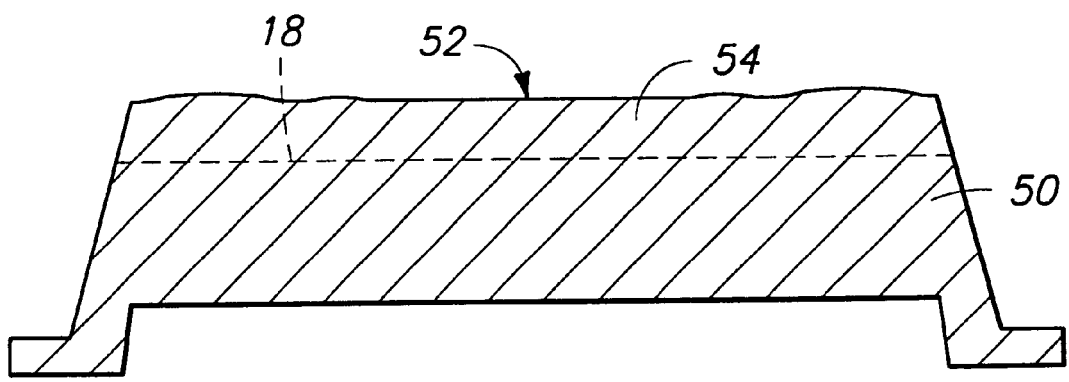
FIG. 11 illustrates a cross-sectional view of sputtering target having a surface with the desired profile of FIG. 10.

Referring to step 112 of FIG. 5, the data from FIG. 10 is utilized to form a target having a surface with a desired target surface profile. Such is shown in FIG. 11, wherein a target 50 is shown having a surface 52 generated with the profile of FIG. 10. Target 50 has a shape corresponding to that of the target that generated the wear pattern of FIG. 3 with additional material defined by the data from FIG. 10 provided to form surface 52. More specifically, a dashed line 18 is shown to illustrate where the initial target of FIG. 3 would have had an upper surface. Additional material 54 is shown provided over dashed line 18, with additional material 54 corresponding to the profile of FIG. 10. Additional material 54 has the surface 52. Surface 52 defines a maximum target thickness determined by the target lifetime parameter y (assuming that $D_{max}$ is used with the curve of FIG. 8 to generate the desired target surface profile), and accordingly will lead to a target having a desired lifetime. Further, profile 52 has a surface planarity defined by the target uniformity parameter z, and accordingly will sputter deposit-material to a desired uniformity on a substrate. Accordingly, methodology of the present invention can provide a target having a desired lifetime, and also a desired sputtering uniformity. The parameters y and z can be determined to match desired specifications for particular target applications.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a sputtering target, comprising:
   determining a wear profile for a sputtering target surface, the wear profile corresponding to a shape of the target surface after the target is subjected to the wear of having material sputtered therefrom;
   calculating an amount of wear at a plurality of positions of the target surface;
   multiplying the amount of wear at the positions by a sputtering uniformity parameter to obtain sputtering uniformity values for the positions, the sputtering uniformity parameter being from 1/16 to 1/6;
   adding an additive value to the sputtering uniformity values to generate a desired profile for a sputtering target sputtering surface; and
   forming a sputtering target with a sputtering surface having the desired profile.

2. A sputtering target formed according to the method of claim 1.

3. The method of claim 1 wherein the formed sputtering target comprises a metallic material.

4. The method of claim 1 wherein the formed sputtering target comprises one or more of aluminum, copper, tantalum, tungsten, cobalt, nickel and titanium.

5. The method of claim 1 wherein the formed sputtering target comprises a ceramic material.

6. The method of claim 1 wherein the formed sputtering target comprises $BaTiO_3$, $Pb(Zr, Ti)O_3$, or $BiSrTaO_3$.

7. A method of forming a sputtering target, comprising: determining a wear profile for a sputtering target surface, the wear profile corresponding to a shape of the target surface after the target is subjected to the wear of having material sputtered therefrom;

calculating an amount of wear at a portion of the target surface relative to other portions of the target surface;

multiplying the amount of wear at the portion by a target lifetime parameter to obtain a first value;

multiplying the amount of wear at the first portion by a sputtering uniformity parameter to obtain a second value, the sputtering uniformity parameter being less than the target lifetime parameter;

multiplying the amount of wear at the other portions by the sputtering uniformity parameter to obtain sputtering uniformity values for the other portions;

using the first value to calculate an additive value;

adding the additive value to at least one of the sputtering uniformity values of the other portions to generate a desired profile for a sputtering target sputtering surface; and forming a sputtering target with a sputtering surface having the desired profile.

8. The method of claim 7 wherein the additive value is a difference value defined as the difference between the second value and the first value.

9. A sputtering target formed according to the method of claim 7.

10. The method of claim 7 wherein the formed sputtering target comprises a metallic material.

11. The method of claim 7 wherein the formed sputtering target comprises one or more of aluminum, copper, tantalum, tungsten, cobalt, nickel and titanium.

12. The method of claim 7 wherein the formed sputtering target comprises a ceramic material.

13. The method of claim 7 wherein the formed sputtering target comprises $BaTiO_3$, $Pb(Zr, Ti)O_3$, or $BiSrTaO_3$.

14. The method of claim 7 wherein the target lifetime parameter is greater than 0 and less than or equal to 1.

15. The method of claim 7 wherein the target lifetime parameter is greater than or equal to 0.2 and less than or equal to 0.5.

16. The method of claim 7 wherein the sputtering uniformity parameter is greater than 0 and less than or equal to 1.

17. The method of claim 7 wherein the sputtering uniformity parameter is greater than or equal to $\frac{1}{16}$ and less than or equal to $\frac{1}{8}$.

18. A method of forming a sputtering target, comprising:

determining a wear profile for a sputtering target surface, the wear profile corresponding to a shape of the target surface after the target is subjected to the wear of having material sputtered therefrom;

allocating the wear profile amongst a plurality of datapoints across the target surface;

for at least some of the datapoints, calculating a difference in height of the target surface after the wear relative to a height of the target surface prior to the wear to generate a plurality of wear definition datapoints;

calculating target lifetime datapoints from at least some of the wear definition datapoints, the calculating the target lifetime datapoints comprising multiplying a magnitude of the at least some of the wear definition datapoints by a target lifetime parameter;

calculating sputtering uniformity datapoints from the at least some of the wear definition datapoints, the calculating the sputtering uniformity datapoints comprising multiplying a magnitude of the at least some of the wear definition datapoints by a sputtering uniformity parameter, the sputtering uniformity parameter being a number less than the target lifetime parameter;

subtracting the target uniformity datapoints from the target lifetime datapoints to obtain difference datapoints;

adding the magnitude of one of difference datapoints to the target uniformity datapoints to generate a desired profile for a sputtering target sputtering surface; and forming a sputtering target with a sputtering surface having the desired profile.

19. The method of claim 18 further comprising determining which of the difference datapoints has the greatest magnitude, and wherein the magnitude of the difference datapoint with the greatest magnitude is added to the target uniformity datapoints to generate the desired profile for the sputtering target sputtering surface.

20. A sputtering target formed according to the method of claim 18.

21. The method of claim 18 wherein the formed sputtering target comprises a metallic material.

22. The method of claim 18 wherein the formed sputtering target comprises one or more of aluminum, copper, tantalum, tungsten, cobalt, nickel and titanium.

23. The method of claim 18 wherein the formed sputtering target comprises a ceramic material.

24. The method of claim 18 wherein the formed sputtering target comprises $BaTiO_3$, $Pb(Zr, Ti)O_3$, or $BiSrTaO_3$.

25. The method of claim 18 wherein the target lifetime parameter is greater than 0 and less than or equal to 1.

26. The method of claim 18 wherein the target lifetime parameter is greater than or equal to 0.2 and less than or equal to 0.5.

27. The method of claim 18 wherein the sputtering uniformity parameter is greater than 0 and less than or equal to 1.

28. The method of claim 18 wherein the sputtering uniformity parameter is greater than or equal to $\frac{1}{16}$ and less than or equal to $\frac{1}{8}$.

29. A method of forming a sputtering target, comprising:

determining a wear profile for a sputtering target surface, the wear profile corresponding to a shape of the target surface after the target is subjected to the wear of having material sputtered therefrom;

dividing the wear profile amongst a plurality of datapoints across the target surface to generate i datapoints $\{S_1 \ldots S_i\}$, where i is a positive integer;

generating i datapoints corresponding to the height of the target surface prior to the wear, the datapoints being $\{R_1 \ldots R_i\}$;

calculating difference datapoints $\{A_1 \ldots A_i\}$, with each datapoint An being defined as $R_n - S_n$;

calculating target lifetime datapoints $\{B_1 \ldots B_i\}$, with each datapoint Bn being defined as $((A_n * y) + Q)$; where y is a constant greater than 0, and Q is a constant which can be 0;

calculating sputtering uniformity datapoints $\{C_1 \ldots C_i\}$, with each datapoint $C_n$ being defined as $((A_n*z)+P)$; where z is a constant greater than 0 and less than y, and wherein P is a constant which can be 0;

calculating difference datapoints $\{D_1 \ldots D_i\}$, with each difference datapoint $D_n$ being defined as $(B_n-C_e)$, and determining which of the difference datapoints has the greatest magnitude, the difference datapoint with the greatest magnitude being defined as $D_{max}$;

calculating a desired surface profile dataset $\{E_1 \ldots E_i\}$, with each datapoint $E_n$ being defined as $(C_n+D_{max})$; and forming a sputtering target with a sputtering surface having the desired surface profile.

30. The method of claim 29 where P is equal to Q.

31. A sputtering target formed according to the method of claim 29.

32. The method of claim 29 wherein the formed sputtering target comprises a metallic material.

33. The method of claim 29 wherein the formed sputtering target comprises one or more of aluminum, copper, tantalum, tungsten, cobalt, nickel and titanium.

34. The method of claim 29 wherein the formed sputtering target comprises a ceramic material.

35. The method of claim 29 wherein the formed sputtering target comprises $BaTiO_3$, $Pb(Zr, Ti)O_3$, or $BiSrTaO_3$.

36. The method of claim 29 wherein y is less than or equal to 1.

37. The method of claim 29 wherein y is greater than or equal to 0.2 and less than or equal to 0.5.

38. The method of claim 29 wherein z is less than or equal to 1.

39. The method of claim 29 wherein z is greater than or equal to 1/16 and less than or equal to 1/6.

* * * * *

UNITED STATES PATENT AND TRADEMARK OFFICE
CERTIFICATE OF CORRECTION

PATENT NO. : 6,497,797 B1
DATED : December 24, 2002
INVENTOR(S) : Jaeyeon Kim

It is certified that error appears in the above-identified patent and that said Letters Patent is hereby corrected as shown below:

Column 1,
Lines 12 and 13, replace "substrate 12 by a distance T/S. Distance TIS is referred to as" with -- substrate 12 by a distance T/S. Distance T/S is referred to as --
Line 22, replace "that target 10 can comprise a circular shape" with -- that target 10 can comprise a circular shape. --

Column 2,
Line 12, replace "face. Accordingly, the uniformity of:film deposition from" with -- face. Accordingly, the uniformity of film deposition from --
Lines 57 and 58, replace "datapoints being $\{R_1...Ri\}$. Difference datapoints $\{A_1...A_i\}$ are" with -- datapoints being $\{R_1...R_i\}$. Difference datapoints $\{A_1...A_i\}$ are --
Line 67, replace "defined as $B_n$-$C_e$). The difference datapoint having the" with -- defined as $(B_n$-$C_n)$. The difference datapoint having the --

Column 4,
Lines 47 and 48, replace "comprised of a plurality of target lifetime datapoints $\{B_1...B_1\}$." with -- comprised of a plurality of target lifetime datapoints $\{B_1...B_i\}$. --

Column 5,
Lines 19 and 20, replace "about 0.001 to 1, and can be from about 1/16 to about 1/16." with -- about 0.001 to 1, and can be from about 1/16 to about 1/6. --
Line 46, replace "corresponding to $B_n$-$C_n$. The shown curve comprises D1D2" with -- corresponding to $B_n$-$C_n$. The shown curve comprises D1, D2 --

Column 8,
Line 18, replace "adding the magnitude of one of difference datapoints to" with -- adding the magnitude of one of the difference datapoints to --
Line 63, replace "datapoint An being defined as $\{R_n$-$S_n\}$;" with -- datapoint $A_n$ being defined as $\{R_n$-$S_n\}$; --
Line 65, replace "each datapoint Bn being defined as $((A_n*y)+Q)$; where" with -- each datapoint $B_n$ being defined as $((A_n*y)+Q)$; where --

UNITED STATES PATENT AND TRADEMARK OFFICE
CERTIFICATE OF CORRECTION

PATENT NO.    : 6,497,797 B1
DATED         : December 24, 2002
INVENTOR(S)   : Jaeyeon Kim It is certified that error appears in the above-identified patent and that said Letters Patent is hereby corrected as shown below:

Column 9,
Line 6, replace "difference datapoint $D_n$ being defined as $(B_n-C_e)$, and" with -- difference datapoint $D_n$ being defined as $(B_n-C_n)$, and --

Signed and Sealed this

Thirteenth Day of May, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,497,797 B1
DATED : December 24, 2002
INVENTOR(S) : Jaeyeon Kim

It is certified that error appears in the above-identified patent and that said Letters Patent is hereby corrected as shown below:

<u>Title page,</u>
Item [75], Inventor, should list the following:
-- Inventor:     Jaeyeon Kim, Veradale, WA (South Korea) --

Signed and Sealed this

Tenth Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,497,797 B1
DATED : December 24, 2002
INVENTOR(S) : Jaeyeon Kim

It is certified that error appears in the above-identified patent and that said Letters Patent is hereby corrected as shown below:

<u>Title page,</u>
Item [75], Inventor citizenship, should read -- Jaeyeon Kim, Veradale, WA (US) -- (as deleted by Certificate of Correction issued August 10, 2004) should be reinstated.

Signed and Sealed this

Twelfth Day of October, 2004

JON W. DUDAS
*Director of the United States Patent and Trademark Office*